(12) United States Patent
Wei et al.

(10) Patent No.: US 11,075,158 B2
(45) Date of Patent: Jul. 27, 2021

(54) MIM STRUCTURE

(71) Applicant: Taiwan Semiconductor Manufacturing Co., Ltd., Hsin-Chu (TW)

(72) Inventors: Chun huan Wei, Hsin-Chu (TW); Pin Yu Hsu, Hsin-Chu (TW); Szu-Yuan Chen, Hsin-Chu (TW); Po-June Chen, Hsin-Chu (TW); Kuan-Yu Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/856,512

(22) Filed: Apr. 23, 2020

(65) Prior Publication Data
US 2020/0279803 A1 Sep. 3, 2020

Related U.S. Application Data

(62) Division of application No. 16/144,747, filed on Sep. 27, 2018, now Pat. No. 10,679,936.

(Continued)

(51) Int. Cl.
*H01L 23/522* (2006.01)
*H01L 49/02* (2006.01)
(Continued)

(52) U.S. Cl.
CPC ...... *H01L 23/5223* (2013.01); *H01L 21/7685* (2013.01); *H01L 21/76816* (2013.01); *H01L 21/76843* (2013.01); *H01L 23/5226* (2013.01); *H01L 23/53266* (2013.01); *H01L 28/91* (2013.01)

(58) Field of Classification Search
None
See application file for complete search history.

(56) References Cited

U.S. PATENT DOCUMENTS 6,731,007 B1 5/2004 Saito
2004/0227242 A1 11/2004 Noguchi
(Continued)

*Primary Examiner* — Steven M Christopher
(74) *Attorney, Agent, or Firm* — Duane Morris LLP

(57) ABSTRACT

Disclosed is a method of manufacturing a three dimensional (3D) metal-insulator-metal (MIM) capacitor in the back end of line, which can provide large and tunable capacitance values and meanwhile, does not interfere with the existing BEOL fabrication process. In one embodiment, a method for fabricating a semiconductor device includes: forming a first conductive feature on a semiconductor substrate; forming a second conductive feature on the semiconductor substrate; forming a first via structure over the first conductive feature; forming a first metallization structure over the first via structure, wherein the first metallization structure is conductively coupled to the first conductive feature through the first via structure; forming a conductive etch stop structure on the first metallization structure; forming a first via hole above the conductive etch stop structure and a second via hole above the second conductive feature, wherein the first via hole exposes the conductive etch stop structure and the second via hole is deeper than the first via hole; and forming a capacitor in the second via hole.

20 Claims, 15 Drawing Sheets

Related U.S. Application Data

(60) Provisional application No. 62/564,932, filed on Sep. 28, 2017.

(51) Int. Cl.
*H01L 21/768* (2006.01)
*H01L 23/532* (2006.01)

(56) References Cited

U.S. PATENT DOCUMENTS

| | | | |
|---|---|---|---|
| 2006/0160299 A1* | 7/2006 | Rao | H01L 28/20 438/250 |
| 2015/0228586 A1 | 8/2015 | Usami | |
| 2018/0233402 A1* | 8/2018 | Suganaga | H01L 23/535 |
| 2018/0308702 A1 | 10/2018 | Chou | |
| 2019/0051596 A1 | 2/2019 | Suo | |
| 2019/0122982 A1 | 4/2019 | Hourami | |

* cited by examiner

200

200

MIM STRUCTURE

RELATED APPLICATION

This application is a divisional application of U.S. patent application Ser. No. 16/144,747, filed Sep. 27, 2018 which claims the benefit of and priority to U.S. Patent Provisional Application No. 62/564,932, filed on Sep. 28, 2017, the content of which is incorporated herein.

BACKGROUND

A capacitor is a standard component in many electronic circuits. A capacitor typically consists of first and second conductive electrodes separated by a dielectric insulating layer disposed between the first and second conductive electrodes. The conductive electrodes in a capacitor can be made of metals or semiconductors that are heavily doped with impurities, while the dielectric layer can be an oxide or other insulating materials (e.g., nitrides and ceramics). Compared to off-chip capacitors, on-chip MIM (metal-insulator-metal) capacitors typically have smaller capacitance values on the order of microfarads per square micrometer ($\mu F$ $\mu m^{-2}$) due to their restricted size.

In order to achieve effectively large capacitance values, a MIM capacitor can be fabricated in a deep trench in the front end of line (FEOL) in a semiconductor substrate where active devices are fabricated, which offers a large capacitance value compared to a standard planar capacitor. However, such deep trench MIM technology on the FEOL requires additional area on the semiconductor substrate and provides poor signal interference. Therefore, it is desirable to provide a method for forming a MIM capacitor with a large capacitance and a small chip area requirement.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

FIGS. 2A, 2B, 2C, 2D, 2E, 2F, 2G, 2H, 2I, and 2J illustrate cross-sectional views of an exemplary semiconductor device with a MIM capacitor during various fabrication stages, made by the method of FIG. 1, in accordance with some embodiments.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The present disclosure provides various embodiments of an on-chip 3D MIM structure and methods of forming the same. In some embodiments, the 3D MIM structure is provided in the back end of line (BEOL) of a semiconductor device where individual devices in the substrate are interconnected with metallization structures and via structures in respective dielectric layers. Such method allows a construction of a 3D MIM capacitor in a deep via hole through a plurality of dielectric layers in the BEOL. Because of a large surface area from the deep via hole extending through the plurality of dielectric layers, a capacitor with a large capacitance value compared to its planar counterpart with a same projected area can be formed. Further, such method allows a formation of the deep via hole and first and second electrodes of the MIM capacitor within the fabrication process of a via structure (e.g., open a via hole and fill with metals) and a metallization structure without introducing additional fabrication steps. In some embodiments, such a deep via hole can be formed by protecting a shallow via hole bottom with a conductive etch stop structure so that the underlying lower metallization structure is protected from the etching solution. Therefore, such method is compatible with the fabrication process of a via structure and thus does not require global change to the fabrication process of the BEOL. By forming such a 3D MIM structure in the BEOL based on such method, a MIM capacitor with a large and tunable capacitance value can be achieved between an active component and a metallization (i.e., conductive) layer or between two horizontal metallization lines in two nonadjacent metallization layers. Finally, such method does not add area burden to the FEOL and thus enhances an efficient use of substrate area for higher density ICs. Accordingly, the above-mentioned issue may be advantageously avoided.

Figure 1:
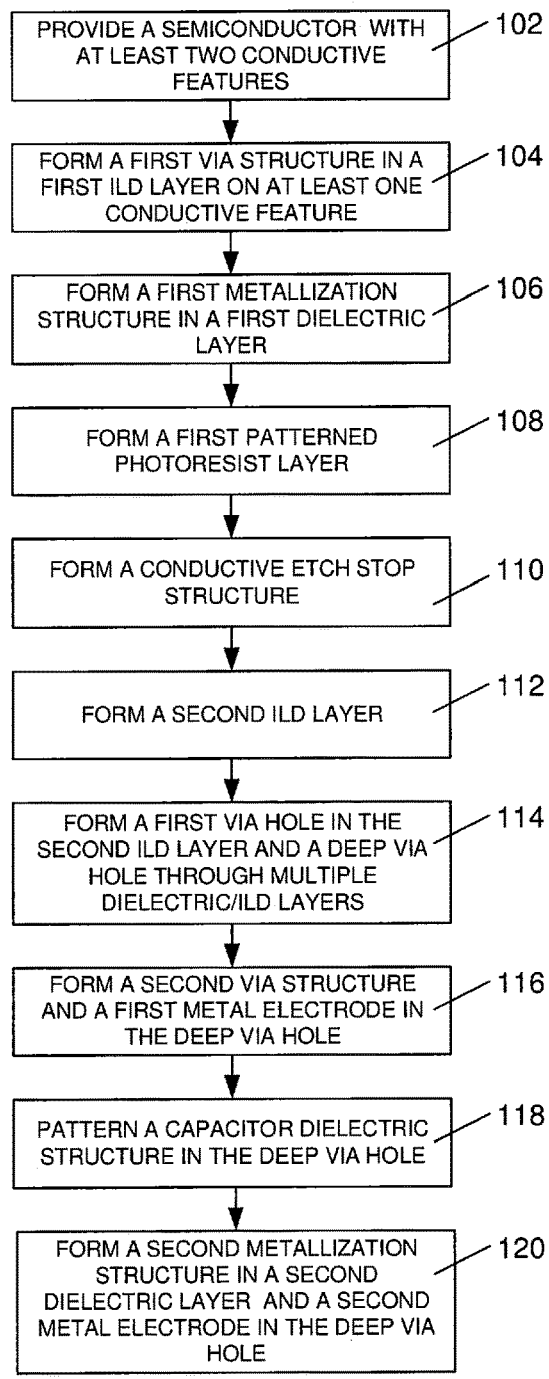
FIG. 1 illustrates a flow chart of an exemplary method for forming a MIM capacitor on a semiconductor device, in accordance with some embodiments.

FIG. 1 illustrates a flowchart of a method 100 to form a semiconductor device according to one or more embodiments of the present disclosure. It is noted that the method 100 is merely an example, and is not intended to limit the present disclosure. Accordingly, it is understood that additional operations may be provided before, during, and after the method 100 of FIG. 1, and that some other operations may only be briefly described herein. In some embodiments, operations of the method 100 may be associated with cross-sectional views of a semiconductor device at various fabrication stages as shown in FIGS. 2A, 2B, 2C, 2D, 2E, 2F, 2G, 2H, 2I, and 2J, respectively, which will be discussed in further detail below.

Referring now to FIG. 1, the method 100 starts with operation 102 in which a semiconductor substrate with at least two conductive features (e.g., a source, drain, and/or gate electrode of a transistor) is provided. The method 100 continues to operation 104 in which a first via structure is formed in a first inter-layer dielectric (ILD) layer. In some embodiments, the first via structure is configured and positioned to allow the at least one conductive feature in the semiconductor substrate to be electrically coupled to another conductive feature or structure through the first via structure. The method 100 continues to operation 106 in which a first metallization structure is formed in a first dielectric layer. In some embodiments, the first dielectric layer is formed over the first ILD layer. In some embodiments, the first metallization structure is electrically coupled to the first via structure. The method 100 continues to operation 108 in which a patterned photoresist layer is formed over the first dielectric layer and the first metallization structure. In some embodiments, the patterned photoresist layer is aligned with the first metallization structure. The method 100 continues to operation 110 in which a conductive etch stop structure is formed over the first metallization layer. In some embodiments, the conductive etch stop structure is formed to provide chemical resistance and etch selectivity to allow the simultaneous etching of shallow via holes and deep via holes within one-step etching process. In some embodiments, the conductive etch stop structure may be formed by performing one etching processes on the conductive protection layer while using the patterned photoresist layer as a mask. In some embodiments, the conductive etch stop structure is aligned with the first metallization structure so that the conductive etch stop structure and first metallization structure are electrically coupled with each other. The method 100 continues to operation 112 in which a second ILD layer is formed. In some embodiments, the second ILD layer is formed over the conductive etch stop structure and the first dielectric layer. The method 100 continues to operation 114 in which a shallow via hole is formed in the second ILD layer and a deep via hole is also formed through the second ILD layer, the first dielectric layer, and the first ILD layer to the lower conductive feature on the semiconductor substrate. The method 100 continues to operation 116 in which a second via structure in the first via hole and a first metal electrode of the MIM capacitor in the deep via hole are formed. The method 100 continues to operation 118 in which a patterned capacitor dielectric structure is formed on top of the first metal electrode in the deep via hole. In some embodiments, the patterned capacitor dielectric structure may be formed by performing one or more lithography and etching processes. The method 100 continues to operation 120 in which a second metallization structure is formed in the second dielectric layer and a second metal electrode on top of the patterned capacitor dielectric structure in the deep via hole. In some embodiments, the second dielectric layer is formed over the second ILD layer. In some embodiments, at least one conductive feature in the substrate is electrically connected to the second metallization structure through the first via structure, the first metallization structure, the conductive protection structure, and the second via structure. In some embodiments, at least one conductive feature in the substrate is electrically connected to the second metallization layer through the vertical MIM capacitor.

As mentioned above, FIGS. 2A-2J illustrate, in a cross-sectional view, a portion of a semiconductor device 200 at various fabrication stages of the method 100 of FIG. 1. The semiconductor device 200 may be included in a microprocessor, memory cell, and/or other integrated circuit (IC). Also, FIGS. 2A-2L are simplified for a better understanding of the concepts of the present disclosure. Although the figures illustrate the semiconductor device 200, it is understood the IC may comprise a number of other devices such as resistors, capacitors, inductors, fuses, etc., which are not shown in FIGS. 2A-2L, for purposes of clarity of illustration.

Figure 2A:
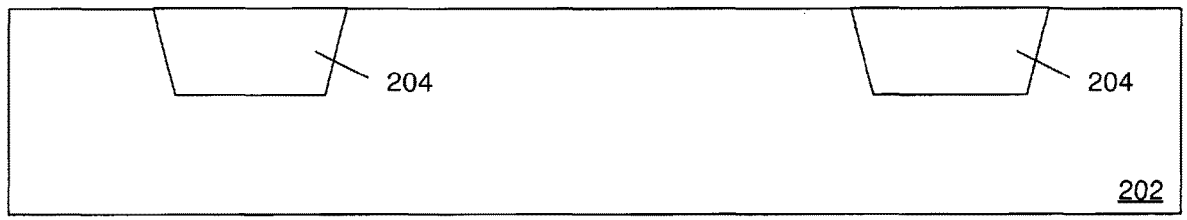

FIG. 2A is a cross-sectional view of the semiconductor device 200 including a substrate 202 with at least two conductive features 204 at one of the various stages of fabrication corresponding to operation 102 of FIG. 1, in accordance with some embodiments. Although the semiconductor device 200 in the illustrated embodiment of FIG. 2A includes only two conductive features (e.g., 204), it is understood that the illustrated embodiment of FIG. 2A and the following figures are merely provided for illustration purposes. Thus, the semiconductor device 200 may include any desired number of conductive features while remaining within the scope of the present disclosure.

In some embodiments, the substrate 202 includes a silicon substrate. Alternatively, the substrate 202 may include other elementary semiconductor material such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate 202 may have an epitaxial layer overlying a bulk semiconductor. Furthermore, the substrate 202 may include a semiconductor-on-insulator (SOI) structure. For example, the substrate 202 may include a buried oxide (BOX) layer formed by a process such as separation by implanted oxygen (SIMOX) or other suitable technique, such as wafer bonding and grinding.

In some embodiments, the substrate 202 also includes various p-type doped regions and/or n-type doped regions, implemented by a process such as ion implantation and/or diffusion. Those doped regions include n-well, p-well, lightly doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 202 may further include other functional features such as a resistor or a capacitor formed in and on the substrate. The substrate 202 further includes lateral isolation features provided to separate various devices formed in the substrate 202, for example shallow trench isolation (STI). The various devices in the substrate 202 further include silicide disposed on S/D, gate and other device features for reduced contact resistance and enhance process compatibility when coupled between devices through local interconnections.

In an embodiment, the conductive features 204 can be a source, drain or gate electrode. Alternatively, the conductive features 204 may be a silicide feature disposed on a source, drain or gate electrode typically from a sintering process introduced by at least one of the processes including thermal heating, laser irradiation or ion beam mixing. The silicide feature may be formed on polysilicon gate (typically known as "polycide gate") or by on source/drain (typically known as "salicide") by a self-aligned silicide technique. In another embodiment, the conductive feature 204 may include an electrode of a capacitor or one end of a resistor.

Figure 2B:
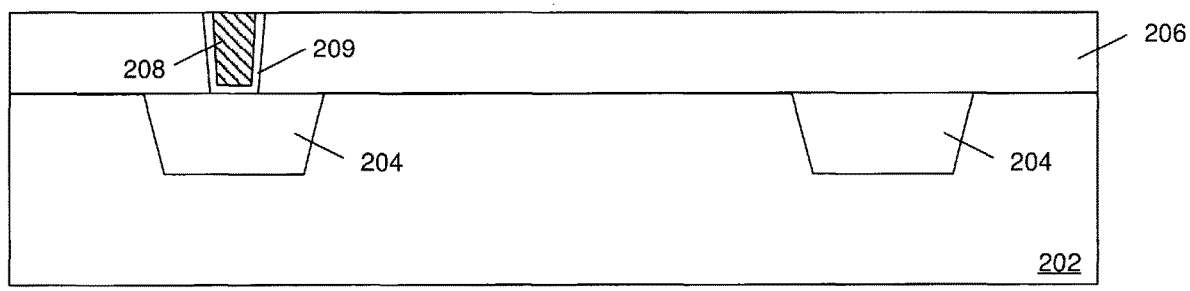

FIG. 2B is a cross-sectional view of the semiconductor device 200 including a first via structure 208 in a first inter-layer dielectric (ILD) layer 206 at one of the various stages of fabrication that corresponds to operation 104 of FIG. 1, in accordance with some embodiments. As shown, the first via structure 208 is configured to extend through the first ILD layer 206 to electrically couple itself to one of the conductive features 204. Alternatively, the first via structure 208 may be a conductive plug. In some further embodiments, the semiconductor device 200 may include a first barrier layer 209 surrounding sidewalls and bottom surface of the first via structure 208.

The first ILD layer 206 includes a material that is at least one of the following materials, including silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. Since the material of a first ILD layer 206 will be used by other dielectric layers formed subsequently, for ease of discussion, the dielectric material is herein referred to as "material D."

In some embodiments, the first via structure 208 includes a metal material such as, for example, copper (Cu), or the like. In some other embodiments, the first via structure 208 may include other suitable metal materials (e.g., gold (Au), cobalt (Co), silver (Ag), etc.) and/or conductive materials (e.g., polysilicon) while remaining within the scope of the present disclosure. Similarly, since the material of the first via structure 208 will be used by other conductive structures formed subsequently, for ease of discussion, the metal material is herein referred to as "material M".

In some embodiments, the first barrier layer 209 includes a conductive material such as a metal, a metal alloy, or a metal nitride, for example, tantalum nitride (TaN), tantalum (Ta), titanium nitride (TiN), titanium (Ti), cobalt tungsten (CoW), tungsten nitride (WN), or the like. The first barrier layer 209 may effectively prevent metal atoms from diffusing into the first ILD layer 206 during a metal deposition process to form the first via structure 208, which will be discussed below. Similarly, since the material of the first barrier layer 209 will be used by other barrier layers formed subsequently, for ease of discussion, the material of the barrier layer 209 is herein referred to as "material B."

The first via structure 208 may be formed by at least some of the following process steps: using chemical vapor deposition (CVD), physical vapor deposition (PVD), spin-on coating, and/or other suitable techniques to deposit the material D over the substrate 202 with the conductive feature 204 to form an initial first ILD layer (the first ILD layer 206 is a remaining portion of the initial first ILD layer after the later performed patterning process); performing one or more patterning processes (e.g., a lithography process, a dry/wet etching process, a soft/hard baking process, a cleaning process, etc.) to form a via hole through the initial first ILD layer; using CVD, PVD, and/or other suitable techniques to deposit the aforementioned material B along a bottom surface and sidewalls of the via hole to surround the via hole; using CVD, PVD, E-gun, and/or other suitable techniques to fill the via hole with the material M, and polishing out excessive material M by a planarization process (e.g., chemical-mechanical polishing) to form the first via structure 208 with the first barrier layer 209.

Figure 2C:
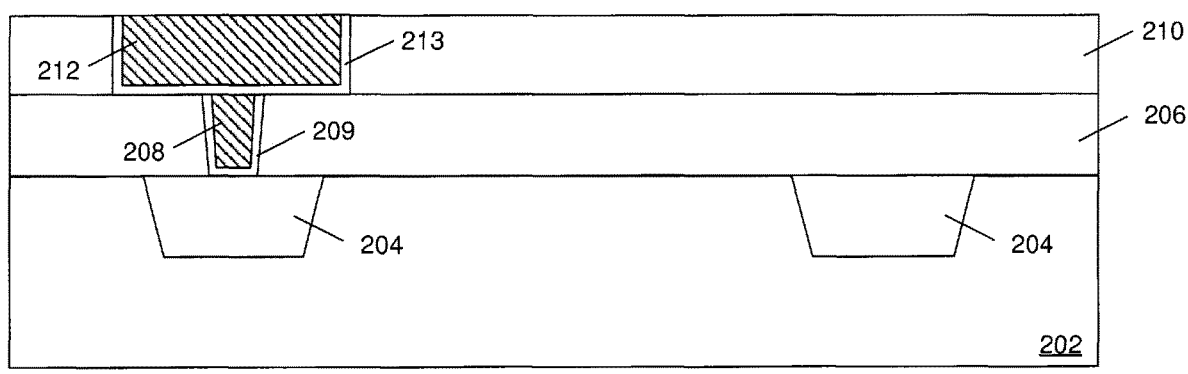

FIG. 2C is a cross-sectional view of the semiconductor device 200 including a first metallization structure 212 formed in a first dielectric layer 210 at one of the various stages of fabrication that corresponds to operation 106 of FIG. 1, in accordance with some embodiments. In some embodiments, the first dielectric layer 210 including the first metallization structure 212 is herein referred to as the "first metallization layer."

As shown, the first metallization structure 212 is coupled to the first via structure 208, and horizontally extends over a respective width in the first dielectric layer 210. In some embodiments, the first metallization structure 212 may be wider than the first via structure 208. In some further embodiments, the semiconductor device 200 may include a second barrier layer 213 surrounding sidewalls and bottom surface of the first metallization structure 212. In some alternative embodiments, the first metallization structure 212 can be directly coupled to the conductive feature 204, i.e., the first via structure 208, the first barrier layer 209, and the first ILD layer 206 may be optional.

In some embodiments, the first dielectric layer 210 includes the material D; the first metallization structure 212 includes the material M; and the second barrier layer 213 includes the material B. The first metallization structure 212 may be formed by at least some of the following process steps: using CVD, PVD, spin-on coating, and/or other suitable techniques to deposit the material D over the first ILD layer 206 and the first via structure 208 to form an initial first dielectric layer (the first dielectric layer 210 is a remaining portion of this initial first dielectric layer after the later performed patterning process); performing one or more patterning processes (e.g., a lithography process, a dry/wet etching process, a soft/hard baking process, a cleaning process, etc.) to form an opening through the initial first dielectric layer; using CVD, PVD, and/or other suitable techniques to deposit the aforementioned material B to surround the opening; using CVD, PVD, E-gun, and/or other suitable techniques to fill the opening with the material M, and polishing out excessive material M by a planarization process (e.g., chemical-mechanical polishing) polishing to form the first metallization structure 212 surrounded by the second barrier layer 213.

Figure 2D:
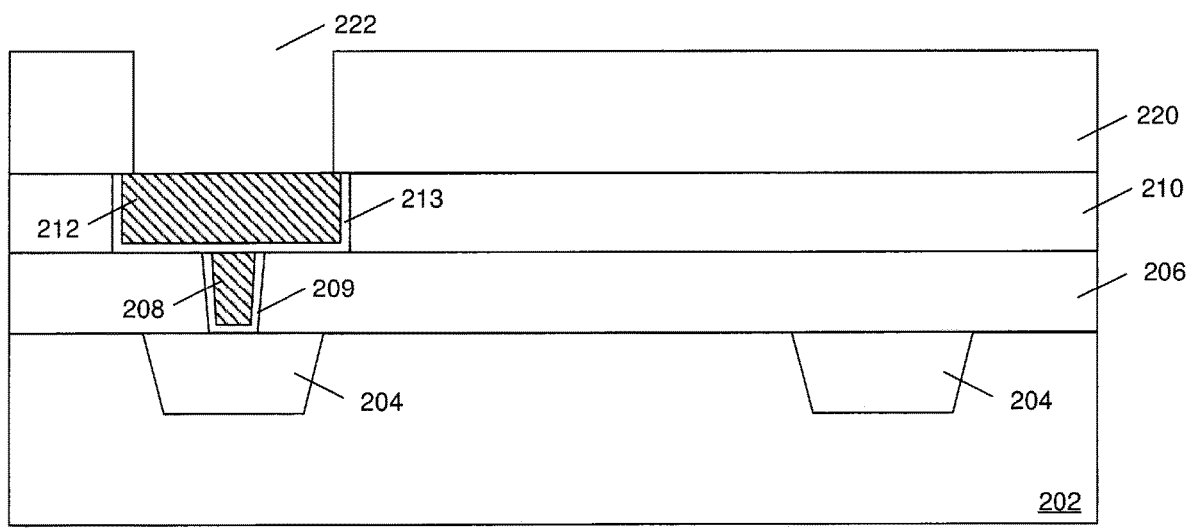

FIG. 2D is a cross-sectional view of the semiconductor device 200 including a first patterned photoresist layer 220 over the first dielectric layer 210 and the first metallization structure 212 at one of the various stages of fabrication that corresponds to operation 108 of FIG. 1, in accordance with some embodiments. As will be described below, the first patterned photoresist layer 220 is used to mask a conductive etch stop structure 224 on top of the first metallization structure 212. Accordingly, in some embodiments, the first patterned photoresist layer 220 is formed after a conventional patterning (e.g., photolithography) processes, to align with at least part of the first metallization structure 212 so as to allow one or more later formed conductive features to be electrically couple to the first metallization structure 212 through the later formed conductive etch stop structure.

In some embodiments, the initial photoresist layer 220 may include a negative or positive tone photoresist layer that is patternable in response to a photolithography light source. In some alternative embodiments, the initial photoresist layer 220 may include an e-beam (electron beam) resist layer (e.g., poly methyl methacrylate, methyl methacrylate, etc.) that is patternable in response to an e-beam lithography energy source. In some embodiments, the initial photoresist layer is formed over the first dielectric layer 210 and the first metallization structure 212 using a deposition process known in the art such as spin-coating, spray-coating, dip-coating, roller-coating, or the like. The initial photoresist layer 220 is then patterned in a lithography process that may involve various exposure, developing, baking, stripping, etching, and rinsing processes. As a result, the patterned photoresist layer 220 is formed such that an opening 222 exposes at least a portion of the top surface of the first metallization structure 212, as shown in FIG. 2D.

Figure 2E:
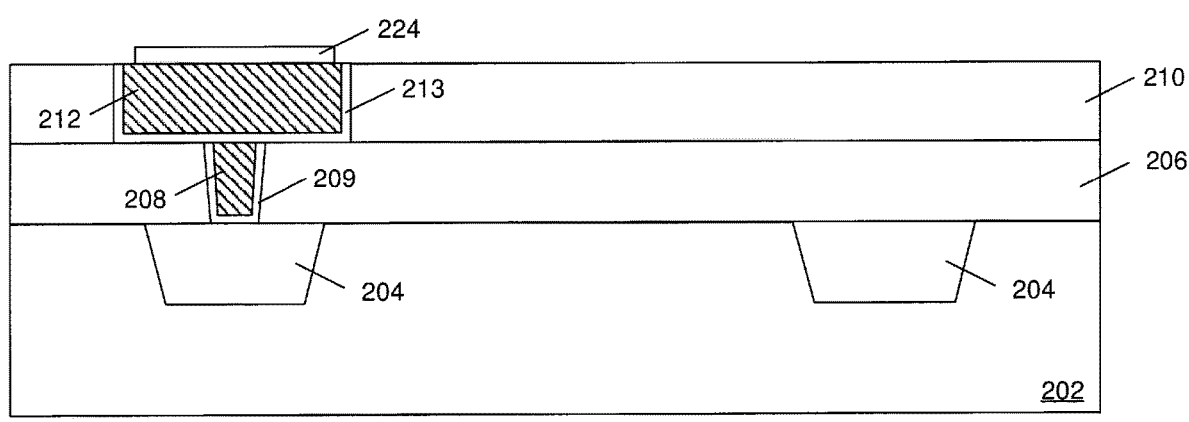

FIG. 2E is a cross-sectional view of the semiconductor device 200 including a conductive etch stop structure 224 at one of the various stages of fabrication that corresponds to operation 110 of FIG. 1, in accordance with some embodiments. In some embodiments, the conductive etch stop structure 224 may be formed from a conductive material such as, for example, titanium nitride (TiN), or the like. In some embodiments, the conductive etch stop structure 224 may be formed by using CVD, PVD, spin-on coating, and/or other suitable techniques to deposit the above-mentioned conductive material (e.g., TiN) over the patterned photoresist layer 220 and the first metallization structure 212, followed by a wet etching of the patterned photoresist layer 220.

In some embodiments, the conductive etch stop structure 224 is metal nitrides, e.g., TiN. In some embodiments, this conductive etch stop TiN layer can be the same as the barrier layer. In some embodiment, the thickness of such conductive etch stop layer is at least 100 nm. In some embodiments, after the deposition, the first patterned photoresist layer 220 may be removed by one or more chemical cleaning processes using acetone, 1-Methyl-2-pyrrolidon (NMP), Dimethyl sulfoxide (DMSO), or other suitable removing chemicals. In some embodiments, the chemicals used may need to be heated to temperatures higher than room temperature to effectively dissolve the first patterned photoresist layer 220. The selection of the remover is determined by the type and chemical structure of the first patterned photoresist layer 220, the first metallization structure 212, the first dielectric layer 210, as well as the substrate to assure the chemical compatibility of these layers with the chemical cleaning process. In some embodiments, this cleaning process is then followed by a rinsing process using isopropyl alcohol or the like, followed by rinsing using deionized water.

As mentioned above, since the patterned photoresist layer 220 is formed to align with at least part of the first metallization structure 212, the conductive etch stop structure 224 can be formed as an intermediate conductive structure to allow the first metallization structure 212 to be electrically coupled by one or more later formed conductive features after the photoresist layer 220 is removed, as described above. Further in some embodiments, the patterned photoresist layer 220 may be narrower than the first metallization structure 212 and the conductive etch stop structure 224 remained from the patterning process may be narrower than the first metallization structure 212, which will be discussed in further detail below.

Figure 2F:
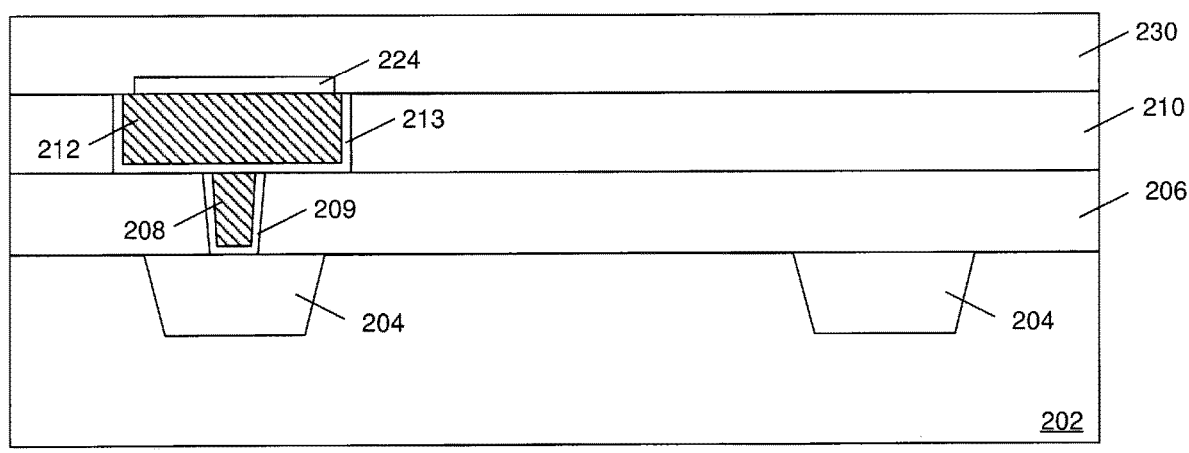

FIG. 2F is a cross-sectional view of the semiconductor device 200 including a second ILD layer 230 formed over the conductive etch stop structure 224, the first dielectric layer 210, and the first metallization structure 212 at one of the various stages of fabrication that corresponds to operation 114 of FIG. 1, in accordance with some embodiments. The second ILD layer 230 includes the material D similar to the one used in the first ILD layer 206, which can be formed using chemical vapor deposition (CVD), physical vapor deposition (PVD), spin-on coating, and/or other suitable techniques.

Figure 2G:
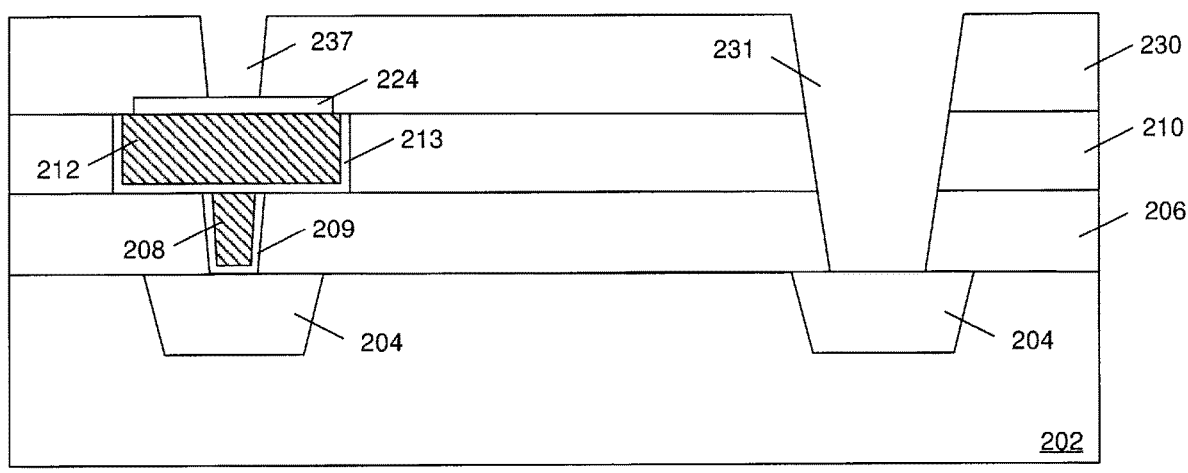

FIG. 2G is a cross-sectional view of the semiconductor device 200 including a via hole 237 formed in the second ILD layer 230 and a deep via hole 231 which may extend through multiple IDL layers and/or dielectric layers, e.g., the first and the second ILD layers (e.g., 206 and 230) and the first dielectric layer (e.g., 210) at one of the various stages of fabrication that corresponds to operation 114 of FIG. 1, in accordance with some embodiments. In some embodiments, the via hole 237 and 231 may be first patterned by performing a conventional photolithography followed by a wet/dry etching process.

As mentioned above, in some embodiments, prior to deposition of the second ILD layer 230, the top surface of the first metallization layer 212 is terminated with the conductive etch stop structure 224 made of a material B so as to stop the etching at the surface of 224 to form the via hole 237, while the etching process in the dielectric layers can continue to a desired depth to form the deep via hole 231. This conductive etch stop structure 224 provides a higher etch resistance against the chemical used to conduct the etching of dielectric materials (the first and the second ILD layers and the first dielectric layer) than the etch resistance of the material D. Therefore, the conductive etch stop structure 224 may prevent the etching in the material M in the metallization layer 212 and provide a control of etching the deep via hole 231 without affecting the existing interconnections.

Figure 2H:
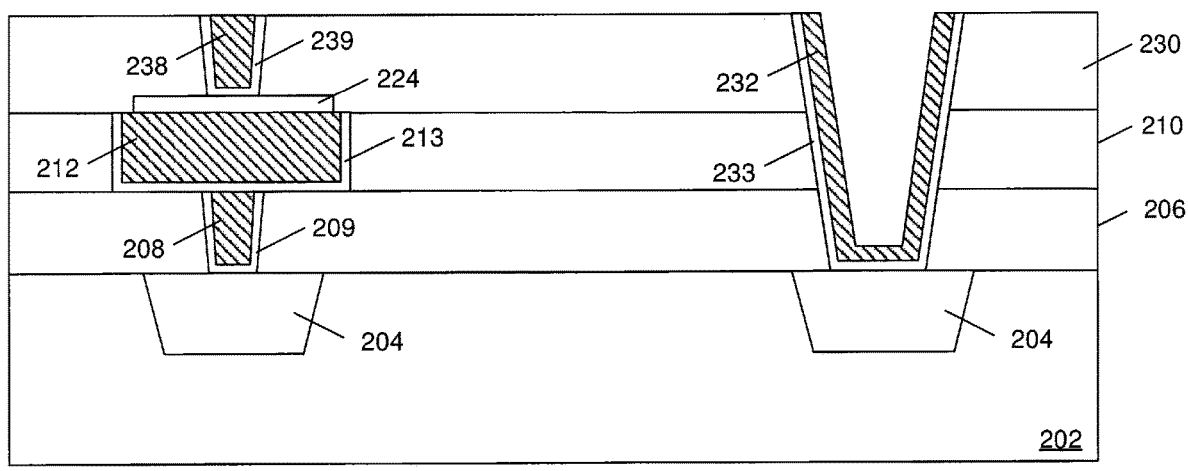
Figure 21:
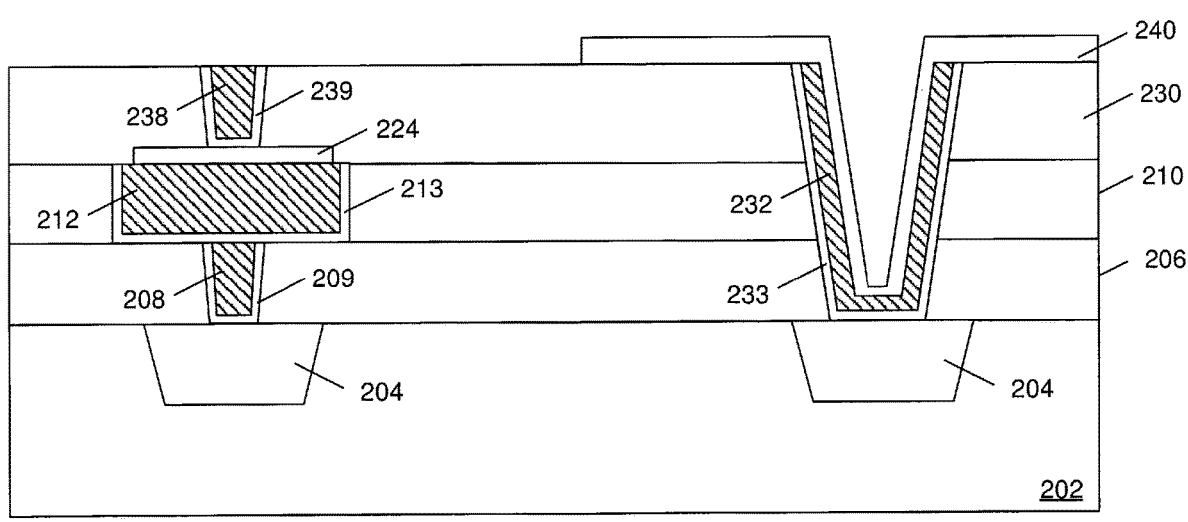

FIG. 2H is a cross-sectional view of the semiconductor device 200 including a second via structure 238 formed in the second ILD layer 230 and a first metal electrode 232 on sidewalls and bottom surface of the deep via hole 231 of a MIM capacitor at one of the various stages of fabrication that corresponds to operation 116 of FIG. 1, in accordance with some embodiments. As shown, the second via structure 238 extends through the second ILD layer 230 to electrically couple to the conductive etch stop structure 224. In some alternative embodiments, the second via structure 238 may be a conductive plug. In some further embodiments, the semiconductor device 200 may include a third barrier layer 239 surrounding sidewalls and bottom surface of the second via structure 238. As such, the second via structure 238 couples to the conductive protection structure 224 through the third barrier layer 239.

In some embodiments, the second via structure 238 also includes the material M, e.g., copper (Cu), tungsten (W), or a combination thereof, similar to the first via structure 208. In some embodiments, the third barrier layer 239 includes material B, e.g., tantalum nitride (TaN), tantalum (Ta), titanium nitride (TiN), titanium (Ti), cobalt tungsten (CoW), tungsten nitride (WN), or the like, similar to the first barrier layer 209. In some embodiments, the second via structure 238 may be narrower than the conductive etch stop structure 224.

The second via structure 238 may be formed by at least one combination of the following process steps: using CVD, PVD, and/or other suitable techniques to deposit the aforementioned material B along a bottom surface and sidewalls of the via holes 237 and 231 to surround the via holes 237 and 231; using CVD, PVD, E-gun, and/or other suitable techniques to deposit material M, and polishing out excessive material M by a planarization process (e.g., chemical-mechanical polishing) to form the second via structure 238 with the third barrier layer 239. In some embodiments, the material M which is thick enough to fill the via hole 237 to form the second via structure 238 is not thick enough to fill the deep via hole 231 and thus can only be deposited on the sidewalls and bottom surface of the deep via hole 231. As a result, the first metal electrode 232 in a first MIM capacitor can be simultaneously formed together with the formation process of the second via structure 238. In some further embodiments, the semiconductor device 200 may include a fourth barrier layer 233 surrounding the sidewalls and bottom surface of the first deep via hole 231. As such, the first metal electrode 232 of a first MIM capacitor couples to the conductive feature 204 through the fourth barrier layer 233. Using the present method, a single step etching of normal via holes for vertical via interconnects and deep via holes for vertical MIM capacitors can be achieved across three dielectric layers in the BOEL. Within the same projected geometric surface area, this method allows larger surface areas and thus larger capacitance values. For example, more than 3 dielectric layers can be used to form the 3D MIM capacitor, which will be discussed further in detail in FIG. 3.

In some embodiments, the sidewalls and bottom surface of the deep via hole 231 can be roughened by depositing an insulating material to create a surface with large roughness.

In some embodiments, a sidewall with large roughness can be also created using a wet/dry etching method. In some embodiments, a roughness can be also created in the first metal electrode during or after the metal deposition process. Thus, the capacitance value can be further increased compared to the one with a flat sidewall surface.

FIG. 2I is a cross-sectional view of the semiconductor device 200 including a capacitor dielectric structure 240 on the second ILD layer 230 and on the first metal electrode 232 on the side wall of the deep via hole 231 at one of the various stages of fabrication that corresponds to operation 118 of FIG. 1, in accordance with some embodiments.

In some embodiments, this capacitor dielectric structure 240 includes the material D. In some embodiments, the capacitor dielectric structure 240 can be structured using a plurality of layers of material D to form a multilayer structure in order to achieve a higher capacitance value, and/or a low equivalent series resistance (ESR) and equivalent series inductance (ESL) in a practical capacitor, which are parameters when using MIM capacitors in devices for high frequency applications.

In some embodiments, the dielectric layer 240 can be formed by anodizing the first metal electrode 232 at a positive potential in an electrolyte, the thickness of which depends on the potential and time. This method allows a complete surface termination of the first metal electrode 232 with a dielectric material 240 for insulating purposes. Since the surface of the first metal electrode 232 is terminated by a layer of passive insulating oxide, the top metal electrode can therefore be self-aligned without additional photolithography processes. The first metal electrode 232 in this case can be Al, Ti, Ta, and Nb, in accordance with some embodiments.

In some embodiments, the capacitor dielectric structure 240 can be deposited using at least one of the techniques including low pressure chemical vapor deposition (LPCVD) and atomic layer deposition (ALD) to provide a uniform step and deep coverage of the deep via hole 231. In some embodiments, materials that can be used in a capacitor dielectric structure 240 include various insulating materials such as, for example $Al_2O_3$, $HfO_2$, $SiO_2$, $La_2O_3$, $ZrO_3$, Ba—Sr—Ti—O, $Si_3N_4$ and laminate of a mixture thereof. In some embodiments, the capacitor dielectric structure 240 comprises a material D with a high dielectric constant, e.g., a high-k dielectric material. The capacitor dielectric structure 240 can be formed by various processes including deposition a dielectric layer using PVD, CVD and the like, photolithography and a dry/wet etching process. The thickness of this capacitor dielectric structure 240 is controlled by the desired capacitance value, which is a function of the area of the deep via hole 231 and the dielectric constant of the dielectric material of the capacitor dielectric structure 240. In some embodiments, the thickness of the capacitor dielectric structure 240 that contains an oxide can be in a range of a few tens of nanometers to a few hundreds of nanometers, e.g., 36-190 nanometers.

In some embodiments, when MIM capacitors are used in RF circuits, the dielectric loss may be extremely small and the series resistance of the wiring may be minimized for high frequency applications. This indicates that it is desirable to use short interconnect wires with low specific resistance. As MIM-capacitors are constructed using the back-end metallization layers, the process temperature for the MIM capacitors, particularly the deposition temperature of the capacitor dielectric structure 240, may be low enough to be compatible with the metallization stack and the low-k dielectric layers (e.g., ILD layers (206 and 230) and metallization dielectric layers (210)).

Figure 2J:
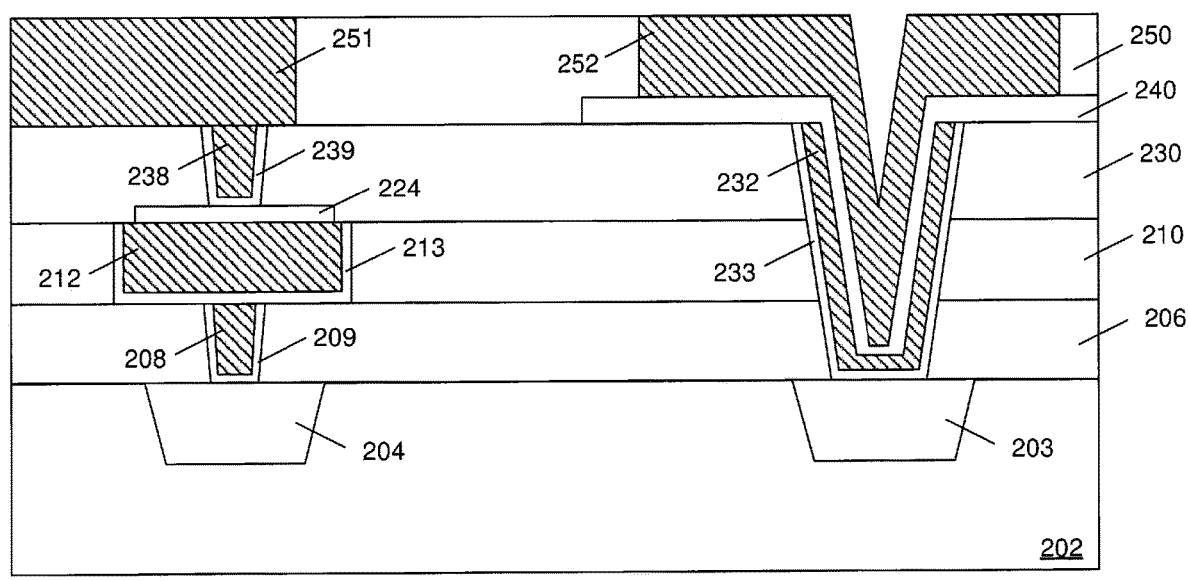

FIG. 2J is a cross-sectional view of the semiconductor device 200 including a second metallization structure 251 and a second metal electrode 252 formed in a second dielectric layer 250 at one of the various stages of fabrication that corresponds to operation 120 of FIG. 1, in accordance with some embodiments. In some embodiments, the second dielectric layer 250 including the second metallization structures 251 is herein referred to as the "second metallization layer." In some embodiments, a thickness of the second metal electrode 252 is in a range of a few tens of nanometers to a few hundreds of nanometers, e.g., ≥400 nanometers.

In some embodiments, the second dielectric layer 250 includes the material D; and the second metallization structure 251 and the second metal electrode 252 include the material M. In some embodiments, a barrier layer (not shown) can be deposited before the deposition of the second metallization structure 251 and the second metal electrode 252. The second metallization structure 251 and the second metal electrode 252 may be formed by at least some of the following process steps: using CVD, PVD, spin-on coating, and/or other suitable techniques to deposit the material D over the second ILD layer 230, the second via structure 238, and the insulating layer 250 to form a second dielectric layer (the second dielectric layer 250 is a remaining portion of this initial second dielectric layer after the later performed patterning process); performing one or more patterning processes (e.g., a lithography process, a dry/wet etching process, a soft/hard baking process, a cleaning process, etc.) to form an opening through the second dielectric layer; using CVD, PVD, E-gun, and/or other suitable techniques to fill the opening with the material M, and polishing out excessive material M by a planarization process (e.g., chemical-mechanical polishing) to form the second metallization structure 251 and the second metal electrode 252.

Although the above-illustrated semiconductor device 200 (FIGS. 2A-2J) includes only two metallization layers (e.g., 210 and 250), any desired number of metallization layers can be included in the semiconductor device 200 while remaining within the scope of the present disclosure. When additional metallization layers are included in the semiconductor device 200, in order to electrically couple respective metallization structures in those additional metallization layers, a plurality of via structures may be used. It is noted that at least one conductive etch stop structure (e.g., 224) may be formed between one of the plurality of via structures (e.g., 238) and its corresponding lower metallization structure (e.g., 212).

Moreover, although the above-illustrated semiconductor device 200 (FIG. 2A-2J) includes one deep via hole where the vertical MIM capacitor (232/233, 240 and 252) is formed is in direct contact with the conductive feature 203 on or in the semiconductor substrate 202, any position through the back-end oxide can be used to incorporate the deep via hole for the construction of the MIM capacitor (232/233, 240 and 252). Such that, although the above-illustrated semiconductor device 200 includes a vertical MIM capacitor (232/233, 240 and 252) which extends from the second metallization layer 250 to the conductive feature 203 on the semiconductor substrate 200, any numbers of deep vertical MIM capacitor that electrically couple to any desired interconnection levels can be included in the semiconductor device 200 at any position in the back-end oxide while remaining within the scope of the present disclosure. Satisfying capacitance values and dynamic response properties can be achieved by adjusting the thickness of the dielectric stacks (e.g., number of ILDs and metallization dielectric layers) and opening area as well as the dielectric constant and thickness of the capacitor dielectric structure between the first and the second metal electrodes.

FIG. 3A-3D are exemplary cross-sectional views of a semiconductor device 200 showing a MIM capacitor in a BEOL on a semiconductor substrate. These are, of course, merely examples and are not intended to be limiting. For example, the capacitor can be at any position within the BEOL 203 between any metallization structures. For another example, the capacitance can extend across any numbers of ILDs and metallization dielectric layers.

Figure 3A:
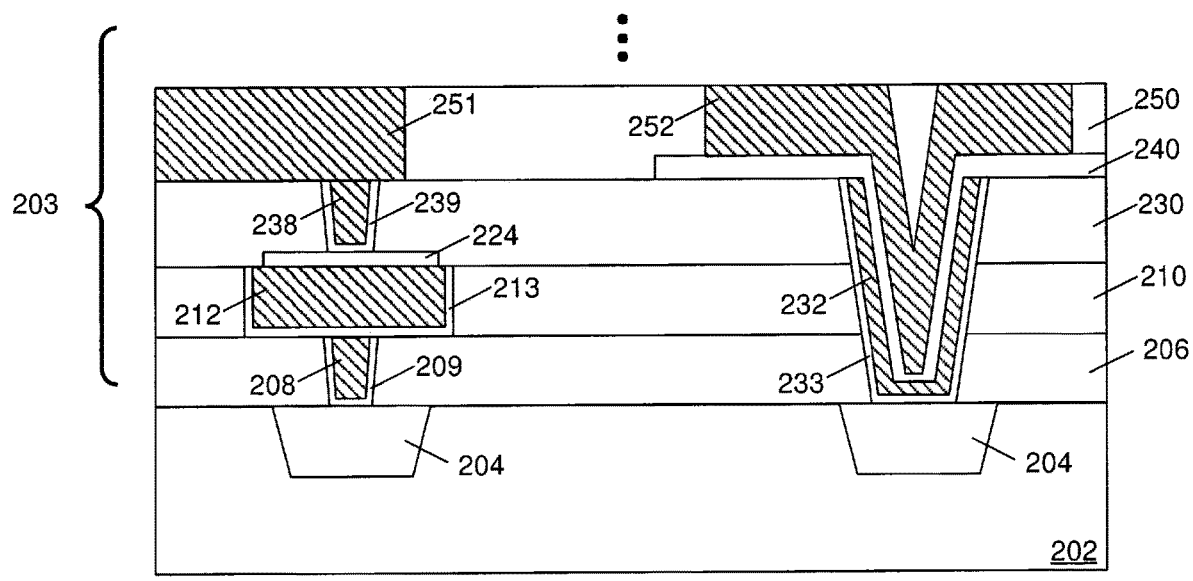
FIGS. 3A, 3B, 3C and 3D illustrate exemplary cross-sectional views of semiconductor devices with MIM capacitors, in accordance with some embodiments.

FIG. 3A illustrates an exemplary cross-sectional view of a semiconductor device 200 with a MIM capacitor in a BEOL 203. The MIM capacitor (232/233, 240 and 252) is electrically coupled to a conductive feature 204 in a substrate 202. A second metal electrode 252 of the MIM capacitor is in the second metallization layer. In the present embodiment, the MIM capacitor is formed across two ILD layers (e.g., 206 and 230) and one dielectric layer of a respective metallization layer (e.g., 210). In some embodiments, the depth of such deep via hole 231 where the MIM capacitor is built can be in a range of a few hundreds of nanometers to a few micrometers, e.g., 2 micrometers (μm). As discussed above in FIG. 2G, the deep via hole 231 where the 3D MIM capacitor is built and the first metal electrode 232 of the MIM capacitor can be achieved together with the fabrication process of a second via structure 238 without introducing additional steps. It is noted that more ILDs and metallization dielectric layers can be constructed on top of the second metallization structures 251, the second metal electrode of the MIM capacitor 252, and metallization dielectric layer 250.

Figure 3B:
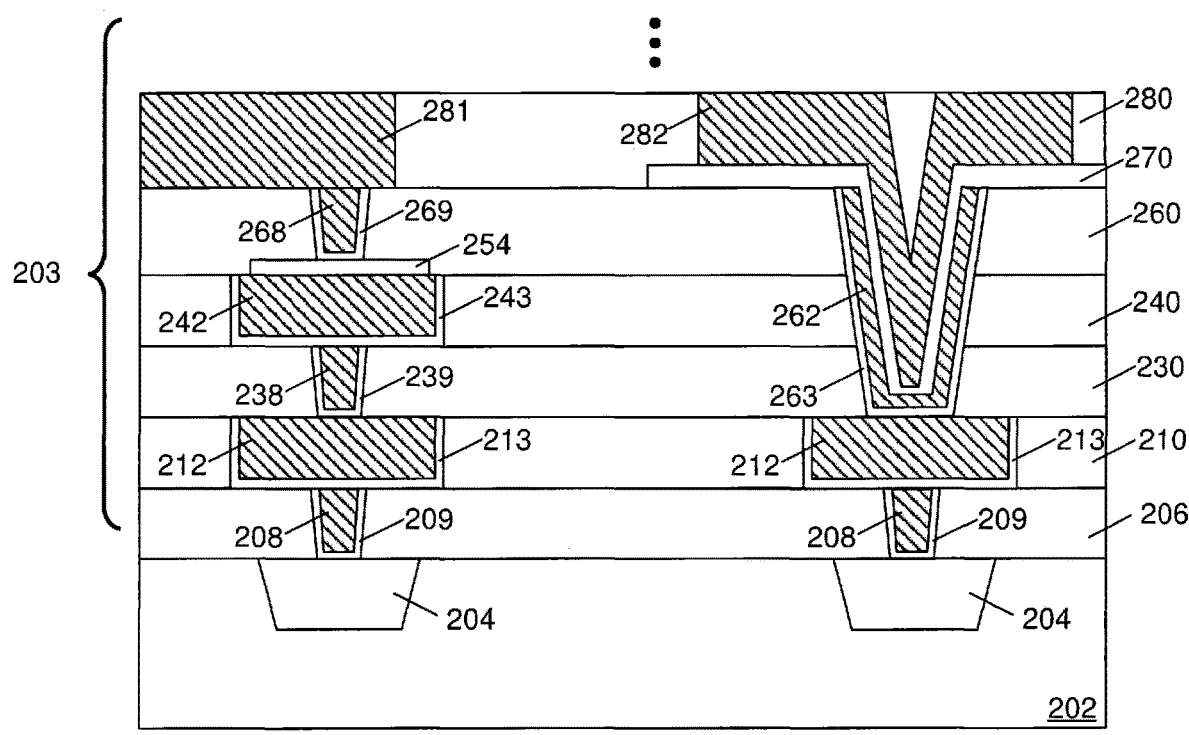

FIG. 3B illustrates a MIM capacitor in the BEOL 203 that is electrically coupled to a third metallization structure 282 and a first metallization structure 212. In some embodiments, the first metallization structure 212 can be electrically coupled to a conductive feature 204 in a substrate 202 through a first via structure 208. In some embodiments, the MIM capacitor including a first metal electrode 262/a barrier layer 263, a dielectric layer 270, and a second metal electrode 282) is formed through second and third ILD layers (e.g., 260 and 230) and a second metallization dielectric layer (e.g., 240). In some embodiments, the depth of the deep via hole can be in a range of a few hundreds of nanometers to a few micrometers, e.g., 2 micrometers (μm). As discussed above in FIG. 2, the deep via hole where the 3D MIM capacitor is built and the first metal electrode of the capacitor 262 can be achieved together with the fabrication process of a third via structure 268 without introducing additional steps, which is enabled by the introduction of a conductive etch stop structure 254 at the bottom of the third via structure 268 to prevent chemical etching of the lower second metallization structure 242. In some embodiments, the thickness of the conductive etch stop structure 254 can be in a range of a few tens of nanometers to a few hundreds of nanometers, e.g., 100 nm. In this present embodiment, the deep via hole where the 3D MIM capacitor is built and the second metal electrode 282 of the capacitor can be achieved together with the fabrication process of the third metallization structure 281 without introducing additional steps. It is noted that more ILDs and metallization dielectric layers can be constructed on the third metallization structures 281, the second metal electrode 282 of the MIM capacitor (262/263, 270, and 282), and metallization dielectric layer 270. In some embodiments, a thickness of the second metal electrode 282 is in a range of a few tens of nanometers to a few hundreds of nanometers, e.g., ≥400 nanometers.

Figure 3C:
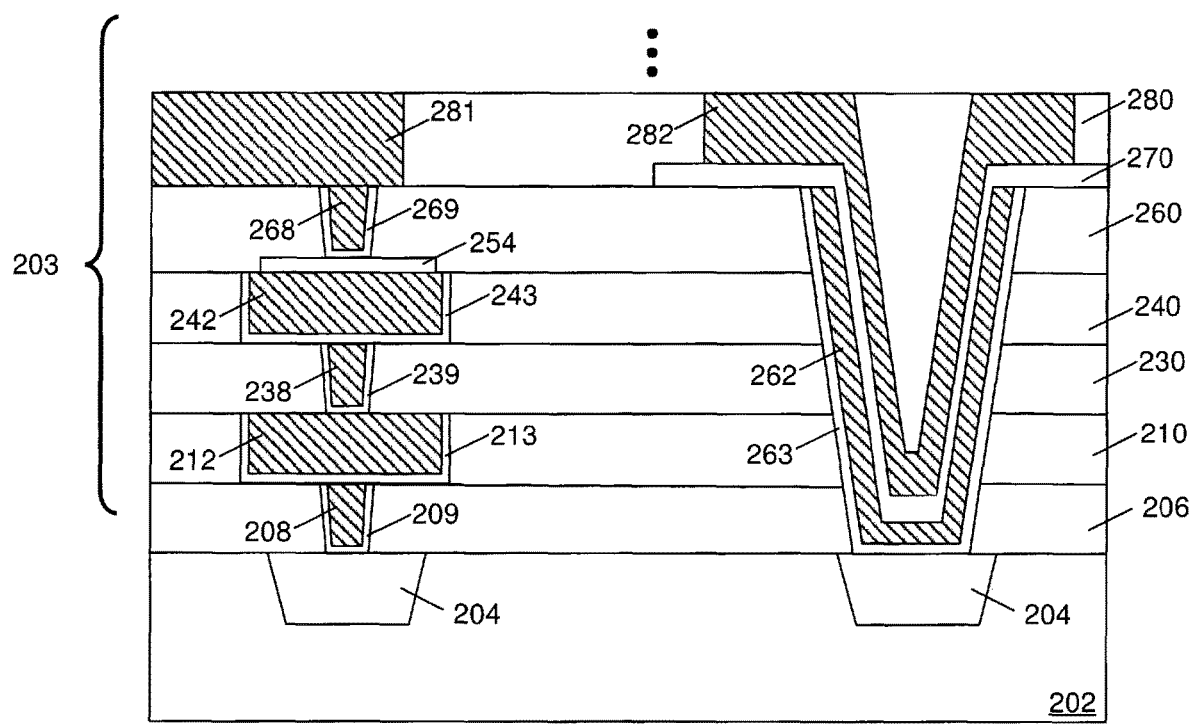

FIG. 3C illustrates a MIM capacitor in the BEOL 203 that is electrically coupled to a conductive feature 204 in a substrate 202 and a third metallization structure 282, which serves as a second metal electrode of the capacitor. In the present embodiment, the MIM capacitor is formed across first, second and third ILD layers (e.g., 206, 230 and 260) and first and second metallization dielectric layer (e.g., 210 and 240). In some embodiments, the depth of such deep via hole where the MIM capacitor is built can be in a range of a few hundreds of nanometers to a few micrometers, e.g., 4 micrometers (m). As discussed above in FIG. 2, the deep via hole where the 3D MIM capacitor is built and the first metal electrode 262 of the capacitor can be achieved together with the fabrication process of a third via structure 268 without introducing additional steps. In some embodiments, the thickness of the conductive etch stop structure 254 between the third via structure 268 and the second metallization structure 242 is thicker than the one used when creating a deep via hole across three dielectric layers as illustrated in FIGS. 3A and 3B. In some embodiments, the thickness of the conductive etch stop structure 254 can be in a range of a few tens of nanometers to a few hundreds of nanometers, e.g., 150 nm. In this present embodiment, the deep via hole where the 3D MIM capacitor is built and the second metal electrode 282 of the capacitor can be achieved together with the fabrication process of the third metallization structure 281 without introducing additional steps. It is noted that more ILD layers and metallization dielectric layers can be constructed on the third ILD layer 280, the third metallization structures 281, the second metal electrode of the MIM capacitor 282, and the capacitor dielectric layer 270.

Figure 3D:
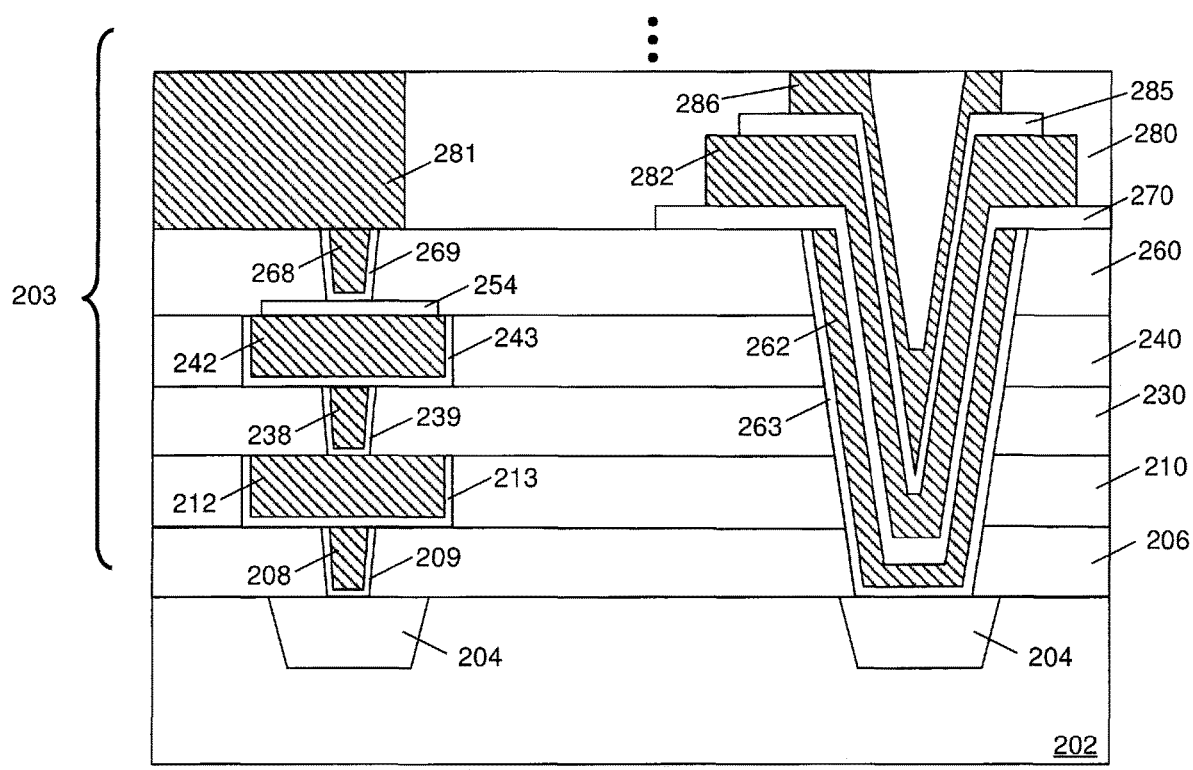

FIG. 3D illustrates a design with multiple MIM capacitors in a single deep via hole to further increase the capacitance density (in μF cm$^{-2}$) within a projected device area, in accordance with some embodiments. In some embodiments, the capacitance values between two metallization lines can be larger. Besides tuning the physical dimensions of the deep via holes, thickness and dielectric function of the capacitor dielectric structure for larger capacitance values, two or more capacitors can be constructed in the same deep via hole and further connected in parallel. In the present embodiment, after deposition of the second electrode 282 of the first MIM capacitor (denoted as "282/270/262" hereinafter), a second capacitor dielectric structure 285 can be patterned on top of the second electrode 282 of the first MIM capacitor, followed by a deposition of the third metallization structure 281 which serves as a second electrode 286 of the second MIM capacitor (denoted as "286/285/282" hereinafter). In some embodiments, the first and the second capacitor share one metal electrode 282. It should be noted that the metal electrode 286 and 262 can be electrically coupled through interconnections in the dielectric layer 280, so that the capacitance value between the metal electrode 282 and the conductive feature 204 on the semiconductor substrate 202 equals to a summation of the capacitance values of the first and the second MIM capacitors, e.g., 282/270/262 and 286/285/282, within the deep via hole. In some embodiments, the shared metal electrode 282 is electrically coupled to later metallization structures and/or interconnect via structures. These are, of course, merely examples and are not intended to be limiting. For example, more than two MIM capacitors can be stack in one deep via hole. In some embodiments, the thickness of the conductive etch stop structure 254 between the third via structure 268 and the second metallization structure 242 is thicker than the one used when creating a deep via hole across three dielectric layers. In some embodiment, the thickness of the conductive etch stop structure 254 can be in a range of a few tens of nanometers to a few hundreds of nanometers, e.g., 150 nm. It is noted that more ILDs and metallization dielectric layers can be constructed on the third ILD layer 280, the third metallization structures 281, the second metal electrode 286 of the second MIM capacitor, the first capacitor dielectric layer 270, the shared metal electrode 282, and the second capacitor dielectric layer 285. In some embodiments, interconnects between metal electrodes of MIM capacitors within the same or across different deep via holes in order to connect them in series or parallel for proper capacitance values are not shown for clarification purpose.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In an embodiment, a method for fabricating a semiconductor device comprising: forming a first conductive feature on a semiconductor substrate; forming a second conductive feature on the semiconductor substrate; forming a first via structure over the first conductive feature; forming a first metallization structure over the first via structure, wherein the first metallization structure is conductively coupled to the first conductive feature through the first via structure; forming a conductive etch stop structure on the first metallization structure; forming a first via hole above the conductive etch stop structure and a second via hole above the second conductive feature, wherein the first via hole exposes the conductive etch stop structure and the second via hole is deeper than the first via hole; and forming a capacitor in the second via hole.

In another embodiment, a semiconductor device comprising: first and second conductive features on a semiconductor substrate; first and second metallization layers configured on the semiconductor substrate above the first and second conductive features, wherein the first and second metallization layers each comprises a respective metallization structure formed in a respective dielectric layer; first and second via structures in respective dielectric layers, wherein the first via structure extends from the first conductive feature to the first metallization layer and wherein the second via structure extends from the first metallization layer to the second metallization layer so as to electrically couple the second metallization structure to the first conductive feature through the first metallization structure; a conductive etch stop structure at the bottom of the second via structure and on at least part of the first metallization structure of the first metallization layer to electrically couple the first metallization structure and the second via structure; and a capacitor embedded and oriented transversely in a plurality of dielectric layers.

Yet in another embodiment, a semiconductor device comprising: a plurality of metallization structures electrically coupled through a plurality of via structures in a plurality of dielectric layers; a plurality of conductive etch stop structures on the plurality of metallization structures; and a plurality of capacitors embedded and oriented transversely in the plurality of dielectric layers, wherein each of the capacitors comprises a capacitor dielectric layer sandwiched between first and second metal electrodes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a semiconductor device comprising:
   forming a first conductive feature on a semiconductor substrate;
   forming a second conductive feature on the semiconductor substrate;
   forming a first via structure over the first conductive feature;
   forming a first metallization structure over the first via structure, wherein the first metallization structure is conductively coupled to the first conductive feature through the first via structure;
   forming a conductive etch stop structure on the first metallization structure;
   forming a first via hole above the conductive etch stop structure and a second via hole above the second conductive feature, wherein the first via hole exposes the conductive etch stop structure and the second via hole is deeper than the first via hole; and
   forming a capacitor in the second via hole.

2. The method according to claim 1 further comprising:
   forming a second via structure within the first via hole; and
   forming a second metallization structure above the second via structure, and forming the capacitor in the second via hole comprising:
   forming a first electrode of the capacitor in the second via hole, wherein forming the second via structure and forming the first electrode are performed simultaneously;
   forming a capacitor dielectric structure of the capacitor on a surface of the first electrode of the capacitor; and
   forming a second electrode of the capacitor above the capacitor dielectric structure, wherein forming the second metallization structure and forming the second electrode are performed simultaneously.

3. The method according to claim 2, wherein the second metallization structure and the first and second conductive features are separated by a plurality of dielectric layers, and the plurality of dielectric layers are etched to form the second via hole.

4. The method according to claim 1, wherein the conductive etch stop structure comprises titanium nitride (TiN).

5. The structure according to claim 4, wherein a thickness of the conductive etch stop structure is equal to or greater than 100 nanometers.

6. The method according to claim 1, wherein the first electrode of the capacitor is formed along the sidewalls and bottom surface of the second via hole.

7. The method according to claim 1, wherein the first electrode of the capacitor comprises tungsten.

8. The method according to claim 1, wherein the first electrode of the capacitor is electrically coupled to the second conductive feature on the semiconductor substrate.

9. A method of making a semiconductor device, comprising:
forming a first conductive feature on a semiconductor substrate;
forming a first metallization layer on the semiconductor substrate above the first conductive feature, wherein the first metallization layer comprises a first metallization structure formed in a first dielectric layer;
forming a first via structure in a second dielectric layer, wherein the first via structure extends from the first conductive feature to the first metallization layer so as to electrically couple the first metallization structure to the first conductive feature;
forming a conductive etch stop structure on at least part of the first metallization structure of the first metallization layer to electrically couple the first metallization structure and the second via structure; and
forming a capacitor that extends vertically through at least the first and second dielectric layers, the capacitor comprising a first metal electrode, a second metal electrode and a dielectric structure sandwiched between the first and second metal electrodes,
wherein the first metal electrode comprises a first sidewall, a second sidewall opposite the first sidewall, a first bottom portion that integrally connects the first and second sidewalls, and a first space formed between the first and second sidewalls and above the first bottom portion, wherein the first and second sidewalls and the first space each extend transversely into at least first and second dielectric layers,
wherein the dielectric structure comprises a third sidewall, a fourth sidewall opposite the third sidewall, a second bottom portion that integrally connects the third and fourth sidewall, and second space formed between the third and fourth sidewalls and above the second bottom portion, wherein the third and fourth sidewalls and the second space each extend into the first space and transversely into at least the first and second dielectric layers, and
wherein the second metal electrode comprises a fifth sidewall and sixth sidewall opposite the fifth sidewall, wherein the fifth and sixth sidewalls each extend into the second space and transversely into at least the first and second dielectric layers.

10. The method of claim 9, wherein the conductive etch stop structure comprises titanium nitride (TiN).

11. The method of claim 9, wherein a thickness of the conductive etch stop structure is equal to or greater than 100 nanometers.

12. The method of claim 9, wherein the capacitor comprises at least one first portion extending transversely through the plurality of dielectric layers and at least one second portion oriented parallel to the dielectric layers.

13. The semiconductor device according to claim 9, wherein the capacitor comprises a first electrode, wherein the first electrode of the capacitor comprises tungsten.

14. The semiconductor device according to claim 13, wherein the first electrode of the capacitor is electrically coupled to the second conductive feature on the semiconductor substrate.

15. A method of making a semiconductor device, comprising:
forming a conductive feature formed in a semiconductor substrate;
forming a metallization layer above the conductive feature, wherein the metallization layer comprises a respective metallization structure formed in a first dielectric layer disposed above the semiconductor substrate;
forming a via structure in a second dielectric layer disposed between the first dielectric layer and the semiconductor substrate, wherein the first via structure extends from the conductive feature to the metallization layer so as to electrically couple the metallization structure to the conductive feature;
forming a conductive etch stop structure disposed on at least part of the metallization structure of the metallization layer, wherein the conductive etch stop structure is formed in a third dielectric layer disposed above the first dielectric layer; and
forming a capacitor that extends transversely through the first and second dielectric layers, the capacitor comprising a first metal electrode, a second metal electrode and a dielectric structure sandwiched between the first and second metal electrodes,
wherein the first metal electrode comprises a first sidewall, a second sidewall opposite the first sidewall, a first bottom portion that integrally connects the first and second sidewalls, and first space formed between the first and second sidewalls and above the first bottom portion, wherein the first and second sidewalls and the first space each extend transversely through the first, second and third dielectric layers,
wherein the dielectric structure comprises a third sidewall, a fourth sidewall opposite the third sidewall, second bottom portion that integrally connects the third and fourth sidewall, and second space formed between the third and fourth sidewalls and above the second bottom portion, wherein the third and fourth sidewalls and the second space each extend into the first space and through the first, second and third dielectric layers, and
wherein the second metal electrode comprises a fifth sidewall and a sixth sidewall opposite the fifth sidewall, wherein the fifth and sixth sidewalls each extend into the second space and through at least two of the first, second, third and fourth dielectric layers.

16. The method of claim 15, wherein the conductive etch stop structure comprises titanium nitride (TiN).

17. The method of claim 15, wherein a thickness of the conductive etch stop structure is equal to or greater than 100 nanometers.

18. The method of claim 15, wherein the first metal electrode comprises tungsten and is electrically coupled to a second conductive feature formed in the semiconductor substrate.

19. The method of claim 15, further comprising:
forming a second via structure above the first metallization structure;
forming a second metallization structure above the second via structure;
forming a second via hole extending through at least the first and second dielectric layers; and
forming the capacitor in the second via hole.

20. The method of claim 19, wherein the second metallization structure and the first and second conductive features are separated by a plurality of dielectric layers, and the plurality of dielectric layers are etched to form the second via hole.

\* \* \* \* \*